United States Patent
Dierichs

(10) Patent No.: US 6,771,352 B2
(45) Date of Patent: Aug. 3, 2004

(54) LITHOGRAPHIC APPARATUS AND DEVICE MANUFACTURING METHOD

(75) Inventor: Marcel Mathijs Theodore Marie Dierichs, Venlo (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/388,766

(22) Filed: Mar. 17, 2003

(65) Prior Publication Data

US 2003/0227603 A1 Dec. 11, 2003

(30) Foreign Application Priority Data

Mar. 18, 2002 (EP) .............................. 02251933

(51) Int. Cl.[7] .................. G03B 27/54; G03B 27/70; G03B 27/72
(52) U.S. Cl. .............................. 355/67; 355/66; 355/71
(58) Field of Search ..................... 355/53, 66, 67, 355/71

(56) References Cited

U.S. PATENT DOCUMENTS

| 5,339,346 A | | 8/1994 | White |
| 5,512,759 A | * | 4/1996 | Sweatt ..................... 250/492.1 |
| 6,225,027 B1 | | 5/2001 | Replogle et al. |
| 6,438,199 B1 | * | 8/2002 | Schultz et al. ................ 378/34 |
| 6,573,978 B1 | * | 6/2003 | McGuire, Jr. ................ 355/71 |

FOREIGN PATENT DOCUMENTS

| DE | 199 35 568 A1 | 2/2001 |
| EP | 0 939 341 A2 | 9/1999 |
| EP | 1 026 547 A2 | 8/2000 |
| EP | 0 939 341 A3 | 4/2001 |
| EP | 1 109 067 A2 | 6/2001 |
| EP | 1 202 101 A2 | 5/2002 |

* cited by examiner

*Primary Examiner*—Rodney Fuller
(74) *Attorney, Agent, or Firm*—Pillsbury Winthrop LLP

(57) ABSTRACT

In an illumination system using mirrors, the facets of a field facet mirror focus plural source images on respective facets of a pupil facet mirror to perform the function of an integrator. A facet mask is constructed and arranged to selectively block facets of the filed or pupil facet mirrors. The facet mask has a grid selectively interposable in the projection beam to provide intermediate illumination settings. The grid has a spacing smaller than the source images but larger than the wavelength of the projection beam so that there is no diffraction.

12 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic projection apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

In a lithographic apparatus, it is important that illumination of the patterning device is uniform in field and angle distribution and, for illumination modes such as dipole and quadrupole illumination, all poles are equal. To achieve this, an integrator is provided in the illumination system. In a lithographic apparatus using UV or DUV exposure radiation the integrator may take the form of a quartz rod or a so-called fly's eye lens. A fly's eye lens is a lens built up of a large number of smaller lenses in an array which creates a correspondingly large number of images of the source in a pupil plane of the illumination system. These images act as a virtual, or secondary, source. However, when using EUV exposure radiation the illumination system must be constructed from mirrors because there is no known material suitable for forming a refractive optical element for EUV radiation. In such an illumination system, a functional equivalent to a fly's eye lens can be provided using faceted mirrors, for instance as described in U.S. Pat. Nos. 6,195,201 and 6,198,793 and EP 0 939 341 A. These documents describe a first, or field, faceted mirror which focuses a plurality of images, one per facet, on a second, or pupil, faceted mirror which directs the light to appropriately fill the pupil of the projection system. It is known from UV and DUV lithography that imaging of different types of mask patterns can be improved by controlling the illumination settings, e.g. the filling ratio of the pupil of the projection system (commonly referred to as σ) or the provision of special illumination modes such as annular, dipole or quadrupole illumination. More information on illumination settings can be obtained from EP 0 949 541 A and EP 1 109 067 A, for example. In an EUV lithographic apparatus with a fly's eye integrator, these illumination settings can be controlled by selectively blocking certain of the pupil facets. However, because the source position and size on each facet is not exactly known and not stable, it is necessary to block off whole facets at a time, rather than partial facets. Thus, only relatively coarse control of illumination settings is possible. Also, to provide an annular illumination setting it is necessary to obscure the innermost pupil facets and when positioning a masking blade over an inner facet it is difficult to avoid partially obscuring one or more of the outer facets.

SUMMARY OF THE INVENTION

It is an aspect of the present invention to provide a lithographic apparatus with an illumination system including reflective optical elements that allows improved control over the illumination settings.

This and other aspects are achieved according to the invention in a lithographic apparatus including a radiation system having reflective optical elements constructed and arranged to supply a projection beam of radiation, the reflective optical elements including a first faceted mirror constructed and arranged to generate a plurality of source images on a second faceted mirror; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; and a facet mask constructed and arranged to selectively mask one or more of the facets of one of the first and second faceted mirrors and comprising a partially-opaque masking blade selectively interposable into the projection beam, the partially-opaque masking blade having an arrangement of opaque and transparent areas having a pitch sufficiently large so as to cause negligible diffraction of the projection beam.

By using a partially-opaque masking blade to selectively mask one or more facets, part of the radiation from that facet can be blocked without causing unacceptable inhomogeneity in the illumination of the patterning device, irrespective of the fact that the exact location of the source image on the pupil facet is not known. In this way, intermediate illumination settings, between masking and not masking whole facets or rings of facets, can be provided.

The pitch should be small relative to the source image, so that the proportion of radiation blocked is independent of the source position, but not sufficiently small to cause diffraction of the projection beam. Preferably, for an apparatus using EUV as the exposure radiation, the pitch is in the range of from 1 mm to 500 nm, dependent on the size of the facets and the illuminated area.

The facet mask is preferably further controlled to adjust the proportion of the area of a facet that is obscured, for example by having a plurality of partially-opaque blades selectively interposable into the projection beams. This enables multiple intermediate illumination settings, providing further versatility.

Preferably, the facet mask is arranged proximate the second (pupil) faceted mirror as this provides the most homogeneous illumination of the patterning device.

A second aspect of the present invention provides a lithographic apparatus as specified in the a radiation system having reflective optical elements constructed and arranged to supply a projection beam of radiation, the reflective optical elements including a first faceted mirror constructed and arranged to generate a plurality of source images on a second faceted mirror; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; and a facet mask constructed and arranged to selectively mask one or more of the facets of the first faceted mirror.

Since all radiation from one facet of the first (field) faceted mirror is incident on one facet of the second faceted mirror, equivalent illumination control can be achieved by selectively blocking field facets as by blocking pupil facets. Normally however, it would not be contemplated to control illumination settings, such as σ, at this position since this is not a pupil plane and so selective obscuration at this position would be expected to cause non-uniformities in the illumination of the patterning device. However, because the field and pupil mirrors are faceted, selective masking of whole field facets can be performed without unacceptable loss of uniformity.

The facets may be arranged so that field facets illuminate pupil facets in different positions, for example facets near the periphery of the field facet mirror may direct radiation to more centrally positioned facets of the pupil facet mirror. Thus annular illumination modes may be set more easily, without partial obscuration of the outer pupil facets and illumination modes that would require masking of inaccessible pupil faces can be set.0

Of course, the facet mask of the second aspect of the present invention may be the same as that of the first aspect and the two aspects may be combined to have selective masking of both field and pupil facets. Thereby, independent control of the inner and outer radii ($\sigma_{inner}$ and $\sigma_{outer}$) of an annular illumination mode can be achieved.

According to a further aspect of the invention there is provided a device manufacturing method including providing a substrate that is at least partially covered by a layer of radiation-sensitive material; providing a projection beam of radiation using a radiation system having reflective optical elements constructed and arranged to supply a projection beam of radiation, the reflective optical elements including a first faceted mirror constructed and arranged to generate a plurality of source images on a second faceted mirror; using a patterning device to endow the projection beam with a pattern in its cross-section; projecting the patterned beam of radiation onto a target portion of the layer of radiation-sensitive material; and selectively masking one or more facets of one of the first and second faceted mirrors by selectively interposing a partially-opaque masking blade into the projection beam, the partially-opaque masking blade having an arrangement of transparent and opaque areas having a pitch sufficiently large so as to cause negligible diffraction of the projection beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet radiation (EUV), e.g. having a wavelength in the range 5–20 nm, especially around 13 nm, as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
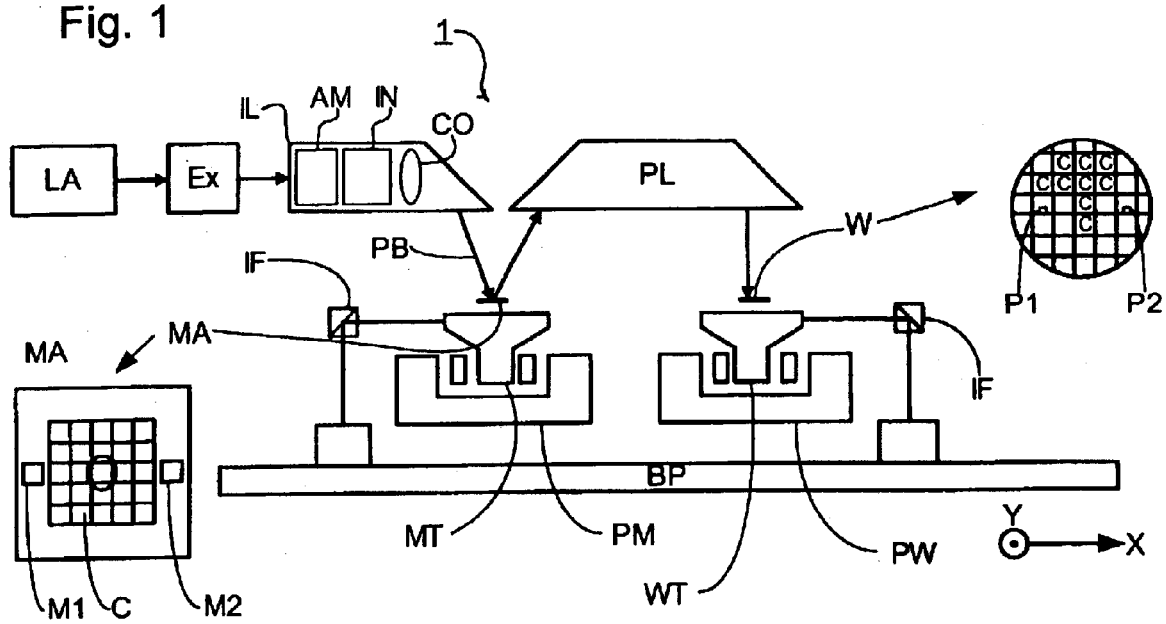
FIG. 1 depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a projection beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as $\sigma$-outer and $\sigma$-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W maybe aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
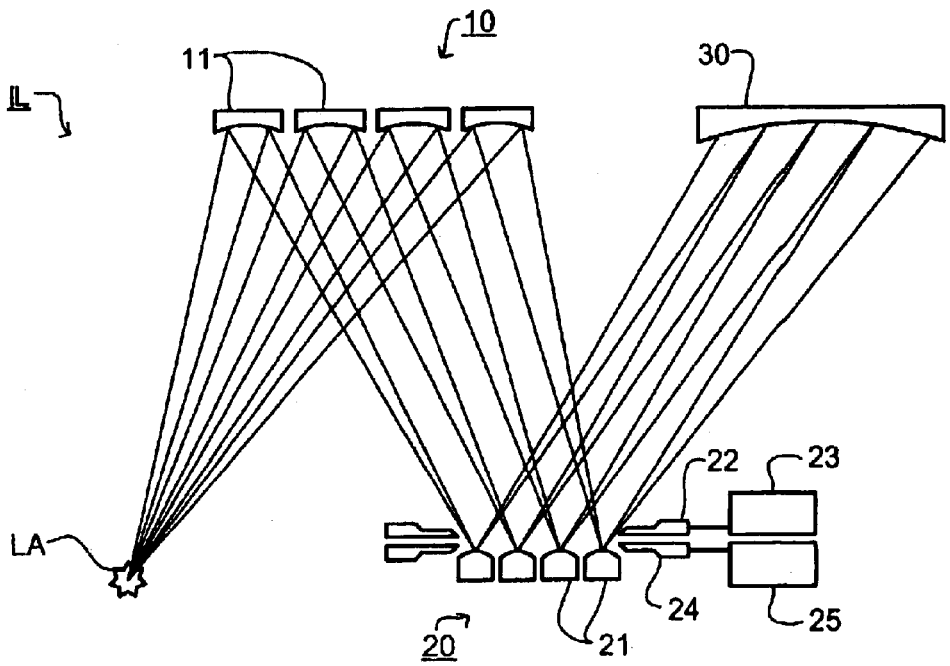
FIG. 2 depicts certain components of the illumination system of the apparatus of FIG. 1.

As shown in FIG. 2, the illumination system includes a field faceted mirror 10 having a plurality of facets 11 which receive radiation from the radiation source LA and form a plurality of images of the source LA on corresponding facets of pupil faceted mirror 20. The pupil facets 21, with the remainder of the illumination system IL, redirect the radiation such that the images of the field facets 11 overlap on the mask MA. The shape of the field facets 11 largely define the shape of the illumination field on the mask MA.

To control the illumination settings for illuminating the mask MA, a facet mask 22–25 is provided. The facet mask 22–25 includes a partially-opaque masking blade 22 and a solid masking blade 24 connected to respective actuators 23 and 25 so as to be selectively and incrementally closeable into the projection beam PB in front of respective facets of the pupil facets 11. Because the image in the pupil of the projection system PL is an image of the pupil faceted mirror 20 (they are in conjugate planes), selectively obscuring the outermost pupil facets 21 allows control over σ, the ratio of the amount of the projection system pupil that is filled, if no diffraction (at the mask) were present. Obscuring the outermost facets reduces σ.

The facet mask 22–25 and its operation is shown in greater detail in FIGS. 3 to 6. Although in these figures the partially-opaque masking blade 22 is shown as solid, it include aa large a number of apertures and opaque areas as possible subject to the constraint that the size and spacing of the apertures and opaque areas must be large compared to the wavelength of the projection beam so that diffraction does not occur and to practical considerations of manufacture. The opaque areas preferably have a total area sufficient to reduce by a predetermined fraction, preferably 50%, the radiation reflected by the pupil facet. It will be appreciated that since the projection beam PB is not incident on the pupil mirror 20 exactly normally, if the facet mask 22–25 is at all spaced from the pupil mirror 20, the total opaque area of the partially-opaque masking blade 22 as a fraction of the area of one of the facets will be a little less than the predetermined fraction of the projection beam PB that is to be absorbed.

Figure 3:
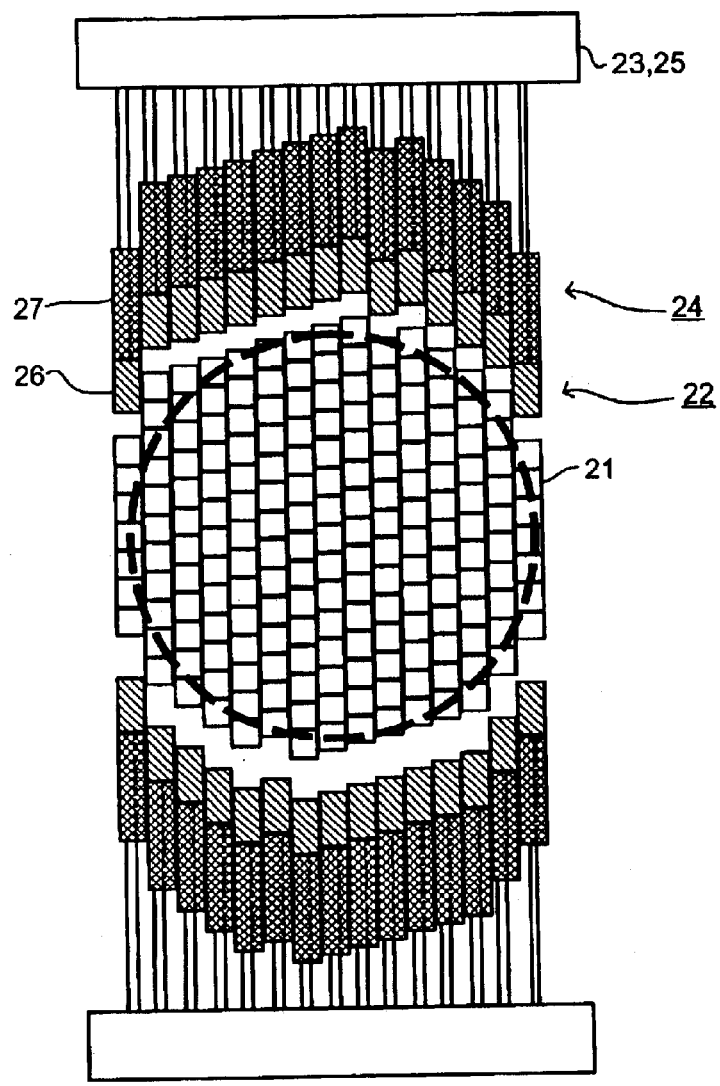
FIGS. 3 to 5 depict the facet masking means of the first embodiment of the invention in various positions.

As can be seen in FIG. 3, the pupil facets 21 are square and arranged in columns. Accordingly, the partially-opaque and solid masking blades 22 and 24 are constructed as a plurality of fingers 26 and 27, one of each per column of pupil facets 21, that are selectively and incrementally extendible to cover ones of the pupil facets 21. Preferably, independent control of each of the fingers 26 and 27 is provided to enable greater flexibility of the illumination settings, however in some circumstances pairs or groups of fingers may be grouped together.

Figure 7:
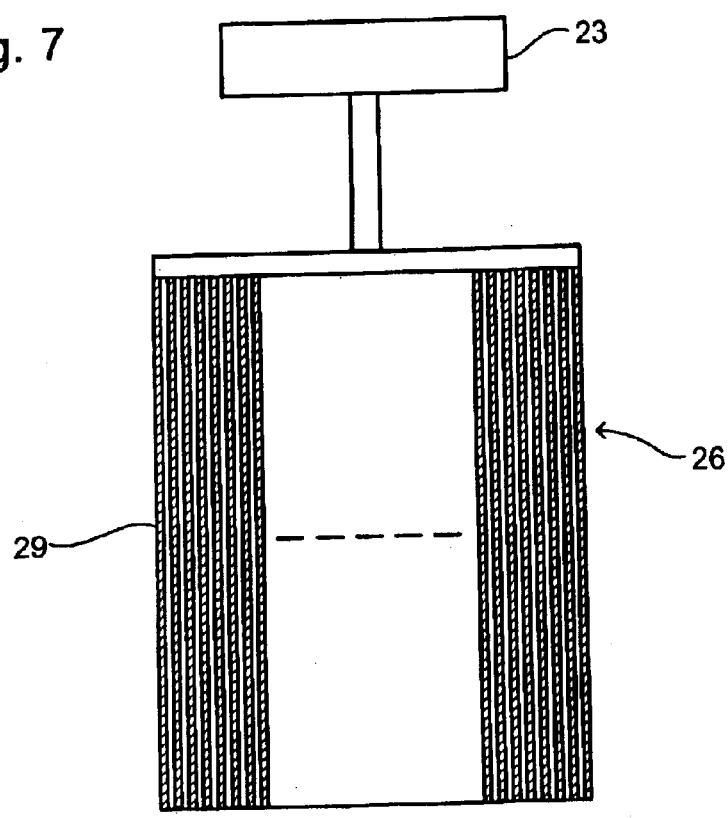
FIG. 7 depicts a partially opaque masking blade in accordance with the first embodiment of the present invention.

The partially-opaque masking fingers 26 may be constructed, for example, as a grid of rods, bars or wires or by forming apertures in a suitable pattern in a solid plate. A partially opaque masking finger 26 formed with a plurality of rods 29 is shown in FIG. 7.

In general, for other shapes and arrangements of pupil facets, the masking blades 22 and 24 may be arranged differently. For example, for pupil facets 21 arranged in concentric rings, the masking blades 22 and 24 may take the form of iris diaphragms. As an alternative to adjustable blades, it is possible to provide a plurality of blades, opaque and partially opaque, corresponding to the desired illumination settings and selectively interpose these into the beam as desired. Such fixed blades may be formed as plates with appropriate openings and partially opaque (apertured) areas and may be held in a magazine or carousel to be inserted into the beam.

Figure 4:
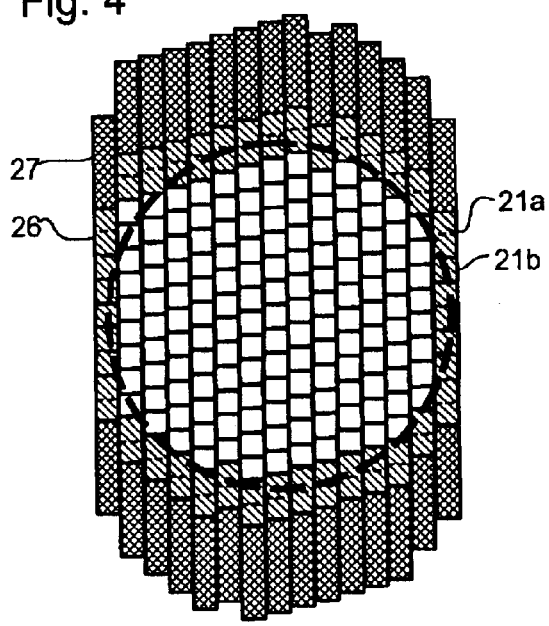
Figure 5:
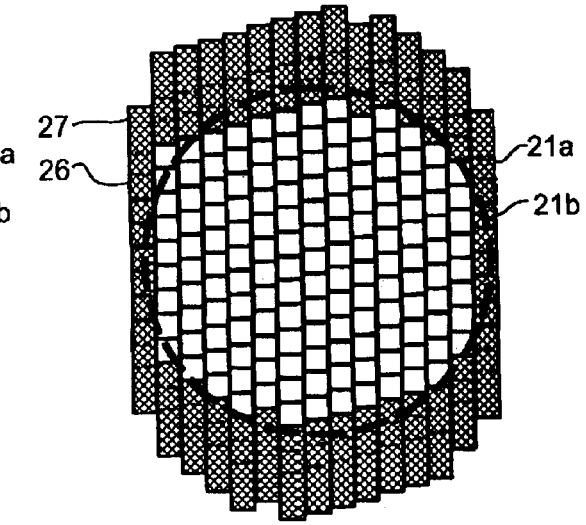

FIG. 3 shows the facet mask 22–25 in its neutral position, with both masking blades 22 and 24 (fingers 26 and 27) open leaving the pupil facets 21 clear. This setting provides the greatest σ. To reduce σ by the smallest amount, effectively a half step, the partially-opaque fingers 26 are extended one step so that the outermost ring of pupil facets 21a is covered, as shown in FIG. 4. The solid fingers 27 remain fully retracted and the inner pupil facets 21b are uncovered. To reduce a further, the solid fingers 27 are extended one step, fully obscuring the outermost ring of pupil facets 21a, as shown in FIG. 5. Again, the inner pupil facets 21b remain uncovered. Further reductions in σ are achieved by further extending the fingers 26 and 27, extending the solid fingers 27 reduces σ in whole steps, while extending the partially-opaque fingers 26 one step more provides a half step reduction in σ. Extending the partially-opaque fingers 26 more than one step more than the solid fingers 27 provides an illumination intensity distribution with a more gradual decrease towards the edge of the pupil. Note that to provide circular illumination modes, the outermost fingers will move to obscure a whole column of facets while the central fingers advance only one facet width. When the central fingers move a further facet inwards the next outermost column will be obscured and so on. The aim being that the area of unobscured facets is as close to circular as possible.

By providing multiple partially-opaque masking blades with different blocking ratios, smaller increments in σ can be provided. For example, with two appropriately aligned partially-opaque masking blades, one blocking 25% of the radiation and one blocking 50%, quarter steps can be provided, the 25% masking blade extended one step more that the solid masking blade provides a quarter step, the 50% masking blade extended one step more gives a half step and both extended one step more gives a three quarter step.

Although the configurations illustrated are rotationally-symmetrical this is not always required or desired. For example, an elliptical pupil configuration may be created by covering facets in one direction only and multipole configurations may be created by covering the appropriate facets only.

Figure 6:
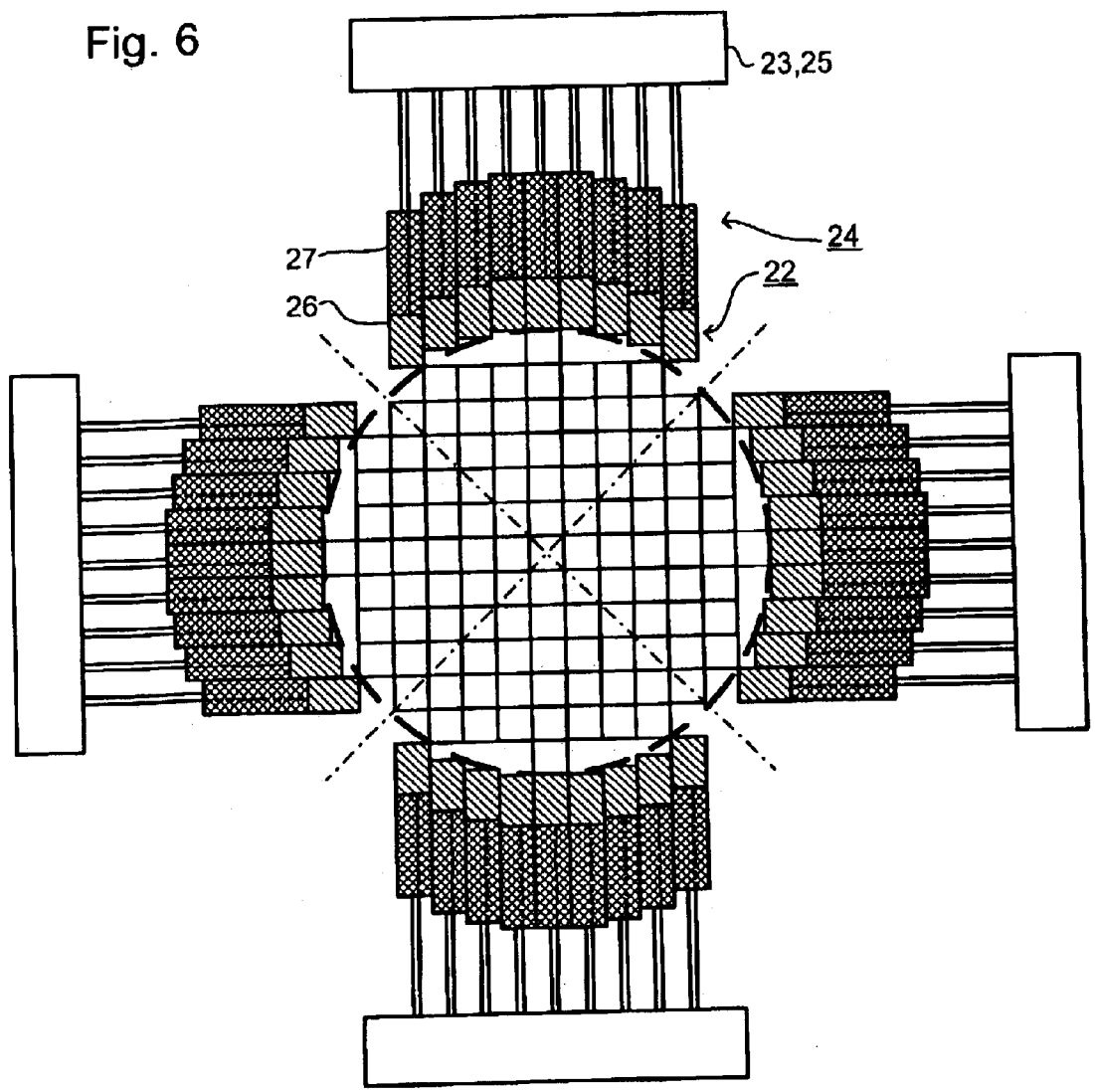
FIG. 6 depicts a partially opaque masking blade used in the first embodiment of the invention.

In a variant of the first embodiment, four sets of facet masking blades are used, arranged around four sides of the facet mirror. This is shown in FIG. 6 and can provide circular illumination modes with shorter movements of the fingers when the facets are arranged on a square grid.

Figure 8:
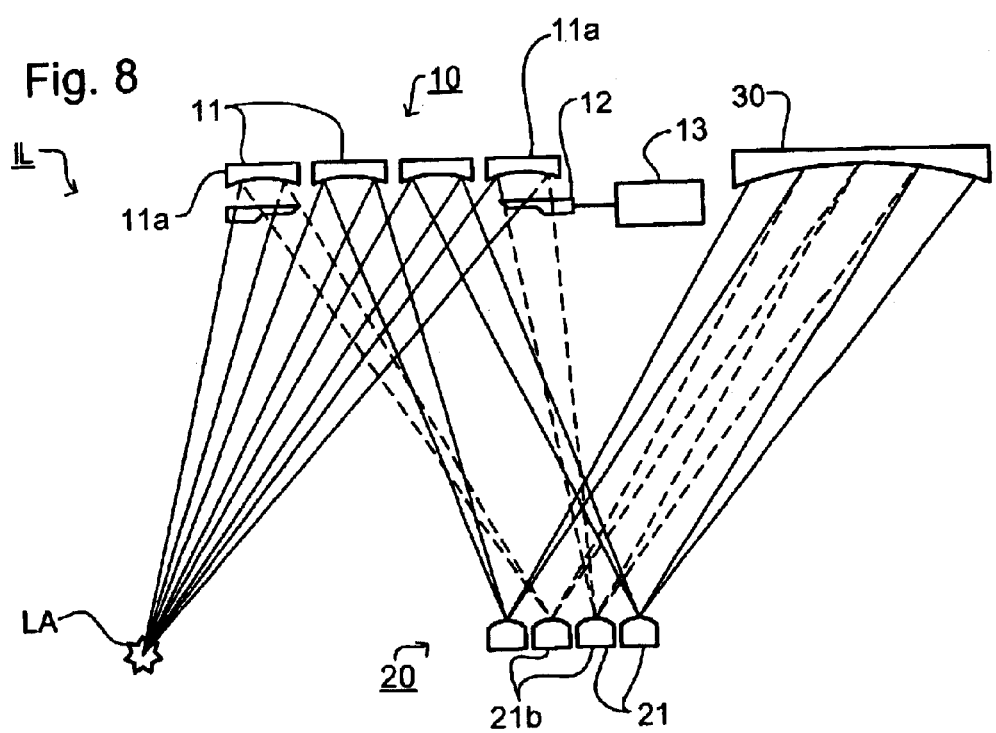
FIG. 8 depicts certain components of the illumination system of a second embodiment of the invention.
Figure 9:
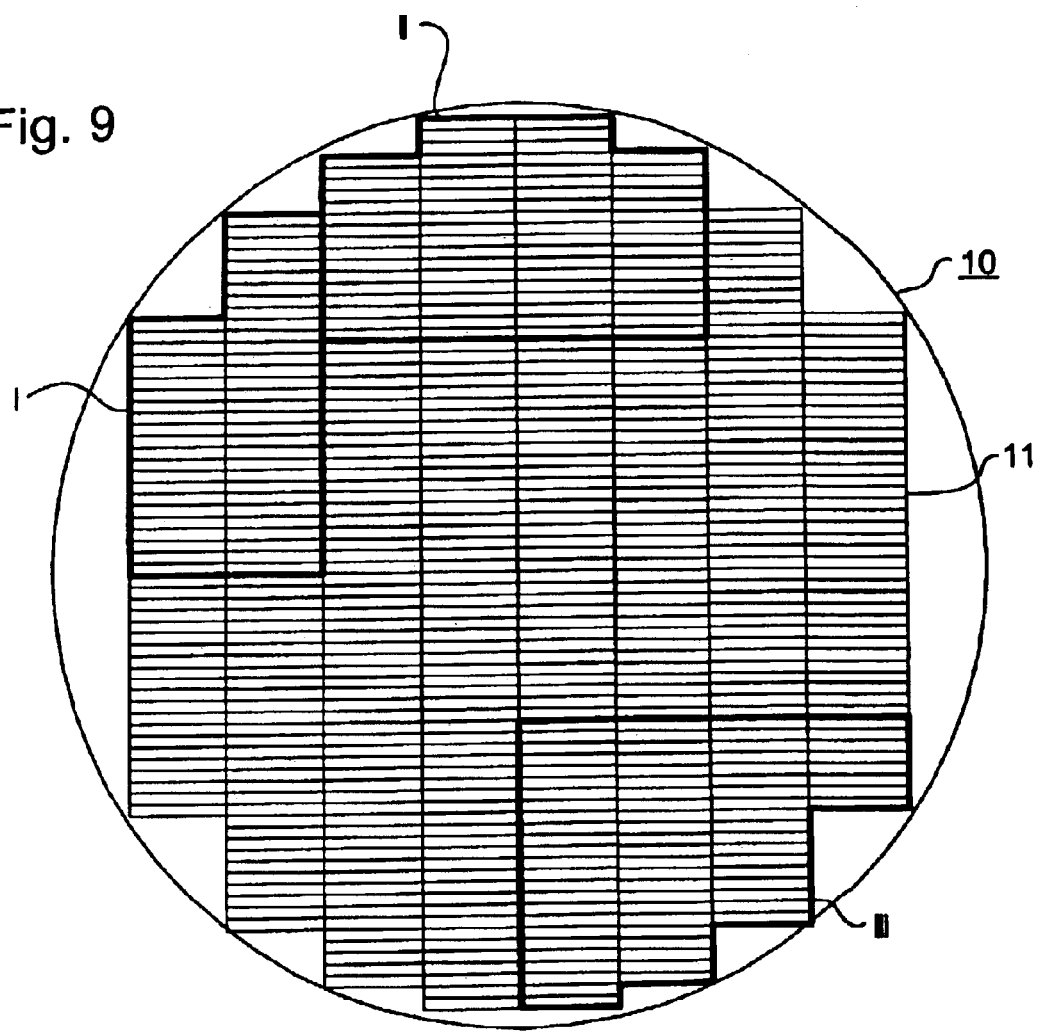
FIG. 9 depicts the field facet mirror of the second embodiment of the invention.

A second embodiment of the invention is shown in FIGS. 8 and 9. A facet mask 12, 13. (masking blade(s) 12 and actuator(s) 13) is provided proximate the field facet mirror 10. The facet mask 12, 13 may comprise a partially-opaque masking blade and a solid masking blade as in the first embodiment or simply a solid masking blade. Placing the facet mask at the field faceted mirror 10 rather than the pupil faceted mirror 20 can be advantageous in that the field facets 11 are generally larger in one direction than the pupil facets 21 so that there is additional room to provide the necessary mechanisms and it is easier to construct the partially-opaque masking blades at a larger scale. However, additional advantages can be obtained if the field facets 11 are arranged to fill pupil facets 21 other than those in the corresponding location in the pupil mirror. For example, the outermost field facets 11a may be arranged to fill the innermost pupil facets 21b and vice versa, as shown in FIG. 8. In that case, closing the facet mask 12, 13 to obscure the outermost field facets 11a removes the illumination from the innermost pupil facets 21b, providing an annular illumination mode.

FIG. 9 shows the field facet mirror 10, which is the same as in the first embodiment. The field facet mirror 10 comprises a plurality of field facets 11 which are rectangular with a high aspect ratio and arranged in rows and columns. The facet mask 12, 13 can be embodied as a plurality of selectively extendible fingers as in the pupil facet mask of the first embodiment or as simple blades to mask a whole block of field facets 11 at a time.

The correspondence between the various pupil facets 21 and field facets 11 can be chosen such that an area of adjacent field facets 11 on field facet mirror 10 corresponds to a specific set of pupil facets 21 on pupil facet mirror 20. For instance, area I of field facets 11 may be chosen to correspond to a ring of pupil facets 21, area II to correspond to another ring of pupil facets and area III to an inner circular area of pupil facets 21. Areas I, II and III are easily blocked by respective masking blades, whereas it might be much harder to block only the corresponding pupil facets, enabling the selection of different σ values or annular illumination. Different arrangements of the correspondence between field and pupil facets can be used to provide other illumination modes, such as dipole and quadrupole configurations and configurations that are complementary to the above configurations.

The facet mask of the first embodiment may be combined with that of the second embodiment to provide independent control of the inner and outer radii of an annular illumination mode ($\sigma_{inner}$ and $\sigma_{outer}$).

While specific embodiments of the invention have been described above, it will be appreciated that the invention may be practiced otherwise than as described. The description is not intended to limit the invention.

What is claimed is:

1. A lithographic projection apparatus, comprising:
   a radiation system having reflective optical elements constructed and arranged to supply a projection beam of radiation, the reflective optical elements including a first faceted mirror for generating a plurality of source images on a second faceted mirror;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate; and
   a facet mask constructed and arranged to selectively mask one or more of the facets of one of the first and second faceted mirrors and comprising at least one partially-opaque masking blade selectively interposable into the projection beam, the at least one partially-opaque masking blade having a regular periodic arrangement of opaque and transparent areas having a pitch sufficiently large so as to cause negligible diffraction of the projection beam and covering substantially an entire facet.

2. An apparatus according to claim 1, wherein the pitch is small relative to the source images.

3. An apparatus according to claim 2, wherein the pitch is in the range of from 1 mm to 500 nm.

4. An apparatus according to claim 1, wherein the facets are arranged in lines and the at least one partially-opaque blade comprises a plurality of partially-opaque fingers selectively extendible along respective lines of facets.

5. An apparatus according to claim 1, wherein the facet mask is arranged proximate the second faceted mirror.

6. An apparatus according to claim 1, wherein the facet mask further comprising at least one solid masking blade selectively interposable into the projection beam to mask at least one of the facets substantially completely.

7. An apparatus according to claim 1, wherein the facet mask is controllable to adjust the proportion of the area of a facet that is obscured by the partially-opaque masking blade.

8. An apparatus according to claim 7, wherein the facet mask has a plurality of partially-opaque masking blades selectively interposable into the projection beam.

9. A lithographic projection apparatus, comprising:
   a radiation system having reflective optical elements constructed and arranged to supply a projection beam of radiation, the reflective optical elements including a first faceted mirror constructed and arranged to generate a plurality of source images on a second faceted mirror;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate; and
   a facet mask constructed and arranged to selectively mask the whole of one or more of the facets of the first faceted mirror.

10. An apparatus according to claim 9, wherein a group of adjacent facets of the first faceted mirror are arranged to direct radiation to a set of facets of the second faceted mirror, the set of facets of the second facetted mirror being arranged in a configuration selected from the group comprising:

substantially annular configurations;

multipole configurations;

substantially circular configurations; and configurations complementary to the above configurations.

11. An apparatus according to claim 9, wherein facets near a periphery of the first faceted mirror are arranged to direct radiation to centrally positioned facets of the second facet mirror.

12. A device manufacturing method, comprising:

providing a substrate that is at least partially covered by a layer of radiation-sensitive material;

providing a projection beam of radiation using a radiation system having reflective optical elements constructed and arranged to supply a projection beam of radiation, the reflective optical elements including a first faceted mirror constructed and arranged to generate a plurality of source images on a second faceted mirror;

using a patterning device to endow the projection beam with a pattern in its cross-section;

projecting the patterned beam of radiation onto a target portion of the layer of radiation-sensitive material; and selectively masking one or more facets of one of the first and second faceted mirrors by selectively interposing at least one partially-opaque masking blade into the projection beam, the at least one partially-opaque masking blade having a regular periodic arrangement of transparent and opaque areas having a pitch sufficiently large so as to cause negligible diffraction of the projection beam, and covering substantially an entire facet.

* * * * *